(12) United States Patent
Davidi et al.

(10) Patent No.: US 10,460,060 B2
(45) Date of Patent: Oct. 29, 2019

(54) CHECKING EQUIVALENCE BETWEEN CHANGES MADE IN A CIRCUIT DEFINITION LANGUAGE AND CHANGES IN POST-SYNTHESIS NETS

(71) Applicant: Mellanox Technologies, Ltd., Yokneam (IL)

(72) Inventors: Or Davidi, Tel Aviv (IL); Roy Armoni, Givat Ada (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 76 days.

(21) Appl. No.: 15/822,241

(22) Filed: Nov. 27, 2017

(65) Prior Publication Data
US 2019/0163844 A1    May 30, 2019

(51) Int. Cl.
*G06F 17/50* (2006.01)

(52) U.S. Cl.
CPC .......... *G06F 17/505* (2013.01); *G06F 17/504* (2013.01)

(58) Field of Classification Search
CPC .............................. G06F 17/505; G06F 17/504
See application file for complete search history.

(56) References Cited

U.S. PATENT DOCUMENTS

| | | | |
|---|---|---|---|
| 5,953,236 A | 9/1999 | Hossain et al. | |
| 6,014,506 A | 1/2000 | Hossain et al. | |
| 6,226,777 B1 * | 5/2001 | Zhang | G06F 17/504 716/104 |
| 6,453,449 B1 * | 9/2002 | Wada | G06F 17/504 716/107 |
| 6,453,454 B1 * | 9/2002 | Lee | G06F 17/5045 716/102 |
| 6,530,073 B2 | 3/2003 | Morgan | |
| 6,691,286 B1 * | 2/2004 | McElvain | G06F 17/5022 702/109 |
| 6,779,170 B1 | 8/2004 | Montrym | |
| 7,007,248 B2 * | 2/2006 | Blinne | G06F 17/5045 700/105 |

(Continued)

OTHER PUBLICATIONS

Golson et al., "The Human ECO Compiler", Synopsys Users Group (SNUG), San Jose, 57 pages, Mar. 21, 2004.

(Continued)

*Primary Examiner* — Nha T Nguyen
(74) *Attorney, Agent, or Firm* — Kligler & Associates

(57) ABSTRACT

A method for circuit design automation includes receiving an initial RTL definition of a design of a circuit, and synthesizing an initial netlist of the circuit based on the initial RTL definition. After synthesizing the initial netlist, an updated RTL definition containing a design change and a corresponding updated netlist are received. The updated RTL definition and netlist are automatically analyzed to identify first and second logical relations that were changed in the RTL definition and netlist, respectively. A notification is issued of sets of the endpoints between which the first logical relations were changed without changes to the second logical relations or vice versa. For the sets of the endpoints between which both the first logical relations and the second logical relations were changed, the equivalence between the first and second logical relations is automatically verified.

13 Claims, 3 Drawing Sheets

(56) References Cited

U.S. PATENT DOCUMENTS

| | | | |
|---|---|---|---|
| 7,231,626 B2* | 6/2007 | Hoff | G06F 17/5045 716/112 |
| 7,454,731 B2 | 11/2008 | Oh et al. | |
| 7,644,382 B2 | 1/2010 | Budumuru | |
| 7,962,876 B2 | 6/2011 | Oh et al. | |
| 8,122,400 B2 | 2/2012 | Hopkins | |
| 8,296,695 B1* | 10/2012 | Chen | G06F 17/505 703/16 |
| 8,370,788 B2 | 2/2013 | Lo | |
| 8,799,838 B2 | 8/2014 | Tanimoto | |
| 9,477,805 B2* | 10/2016 | Bencivenga | G06F 17/504 |
| 9,576,091 B1* | 2/2017 | Evans | G06F 17/5045 |
| 9,817,929 B1* | 11/2017 | Chauhan | G06F 17/5045 |
| 2002/0129325 A1* | 9/2002 | Tanaka | G06F 17/505 716/103 |
| 2002/0162086 A1* | 10/2002 | Morgan | G06F 17/5045 716/102 |
| 2003/0172045 A1 | 9/2003 | Rindner | |
| 2006/0010342 A1 | 1/2006 | Kanamaru | |
| 2006/0225008 A1* | 10/2006 | Schleicher, II | G06F 17/505 716/104 |
| 2007/0271537 A1* | 11/2007 | Budumuru | G06F 17/504 716/103 |
| 2008/0127014 A1 | 5/2008 | Pandey et al. | |
| 2008/0127015 A1 | 5/2008 | Chandramouli et al. | |
| 2008/0222595 A1* | 9/2008 | Hsin | G06F 17/505 716/104 |
| 2010/0281443 A1* | 11/2010 | Lo | G06F 17/5045 716/136 |
| 2012/0054698 A1* | 3/2012 | Arbel | G06F 17/505 716/102 |
| 2012/0278771 A1* | 11/2012 | Ren | G06F 17/505 716/102 |
| 2014/0129998 A1* | 5/2014 | Shrivastava | G06F 17/504 716/103 |
| 2016/0328506 A1* | 11/2016 | Shupe | G06F 17/5045 |
| 2017/0083650 A1 | 3/2017 | Ashar | |
| 2018/0181683 A1* | 6/2018 | Armoni | G06F 17/5022 |

OTHER PUBLICATIONS

Lubyanutsky et al., "Cone Resynthesis ECO Methodology for Multi-Million Gate Designs", 22nd International Conference on VLSI Design, 5 pages, year 2009.

Jayalakshmi., "Auto ECO Flow Development for Functional EGO Using Efficient Error Rectification Method Based on FV Tool", Intel Corporation, 22 Pages, year 2009.

Armoni et al., U.S. Appl. No. 15/387,958 filed Dec. 22, 2016.

U.S. Appl. No. 16/010,536 Office Action dated Aug. 13, 2019.

* cited by examiner

CHECKING EQUIVALENCE BETWEEN CHANGES MADE IN A CIRCUIT DEFINITION LANGUAGE AND CHANGES IN POST-SYNTHESIS NETS

FIELD OF THE INVENTION

The present invention relates generally to electronic circuit design tools, and specifically to methods for verifying the correctness of changes made in circuit designs using such tools.

BACKGROUND

Semiconductor chip designers commonly write their circuit design definitions in a high-level design language, such as a register-transfer level (RTL) definition written in a standardized hardware-description language (HDL), for example Verilog or VHDL. This RTL circuit definition is synthesized automatically into a gate-level netlist. The process then continues, using the netlist, to physical design and layout.

While these activities are going on, verification and bug-fixing activities continue on the RTL design, leading to changes in the RTL circuit definition. Reflection of such changes in the netlist is called an ECO (Engineering Change Order). Re-synthesis of the entire netlist to reflect the change is a time-consuming and resource-intensive process. Therefore, when possible, engineers attempt to implement the ECO by making changes directly to the netlist.

SUMMARY

Embodiments of the present invention that are described hereinbelow provide automated methods and tools for verifying the correctness of changes made in a circuit design.

There is therefore provided, in accordance with an embodiment of the invention, a method for circuit design automation, which includes receiving an initial RTL definition of a design of a circuit, the design including multiple endpoints and first logical relations between sets of the endpoints. An initial netlist of the circuit is synthesized based on the initial RTL definition. The netlist includes second logical relations between the sets of the endpoints. After synthesizing the initial netlist, a design automation computer receives an updated RTL definition, containing a design change relative to the initial RTL definition, and a corresponding updated netlist.

The design automation computer automatically analyzes the updated RTL definition and the updated netlist so as to identify the first logical relations and the second logical relations that were changed in the updated RTL definition and the updated netlist, respectively, relative to the initial RTL definition and the initial netlist. A notification is issued from the design automation computer of the sets of the endpoints between which the first logical relations were changed without changes to the second logical relations and the sets of the endpoints between which the second logical relations were changed without changes to the first logical relations. For the sets of the endpoints between which both the first logical relations and the second logical relations were changed, the design automation computer automatically verifies an equivalence between the first logical relations in the updated RTL definition and the second logical relations in the updated netlist.

In some embodiments, automatically analyzing the updated RTL definition and the updated netlist includes identifying the sets of the endpoints between which neither the first logical relations nor the second logical relations were changed in the updated RTL definition and the updated netlist, wherein the design automation computer does not verify the equivalence between the first logical relations in the updated RTL definition and the second logical relations in the updated netlist for the identified sets. Typically, the design automation computer verifies the equivalence between the first logical relations in the updated RTL definition and the second logical relations in the updated netlist only for the sets of the endpoints between which both the first logical relations and the second logical relations were changed.

In some embodiments, automatically verifying the equivalence includes applying a satisfiability (SAT) solver to prove a proposition that the first logical relations in the updated RTL definition and the second logical relations in the updated netlist are equivalent for the sets of the endpoints between which both the first logical relations and the second logical relations were changed, wherein the SAT solver is applied under an assumption that the first logical relations were equivalent to the second logical relations in the initial RTL definition and the initial netlist.

In a disclosed embodiment, applying the SAT solver includes finding a counter-example demonstrating that at least one of the second logical relations in the updated netlist is not equivalent to a corresponding first logical relation in the updated RTL definition, and identifying and reporting a fan-in difference between the end points of the at least one of the second logical relations in the initial and updated netlists. Typically, identifying and reporting the fan-in difference includes identifying nets in the updated netlist that are associated with an endpoint of the at least one of the second logical relations, and identifying the nets includes finding a difference between inputs that affect the endpoint in the initial and updated netlists.

In one embodiment, the method includes automatically making an assignment between wires in the RTL definition and corresponding nets in the netlist, while applying a satisfiability (SAT) solver to verify that one or more of the wires are equivalent to one or more of the corresponding nets.

There is also provided, in accordance with an embodiment of the invention, apparatus for circuit design automation, including a memory, which is configured to store an initial RTL definition of a design of a circuit, the design including multiple endpoints and first logical relations between sets of the endpoints, and an initial netlist of the circuit synthesized from the initial RTL definition, the netlist including second logical relations between the sets of the endpoints. A processor is coupled to receive, after synthesis of the initial netlist, an updated RTL definition, containing a design change relative to the initial RTL definition, and a corresponding updated netlist, and is configured to automatically analyze the updated RTL definition and the updated netlist in the design automation computer so as to identify the first logical relations and the second logical relations that were changed in the updated RTL definition and the updated netlist, respectively, relative to the initial RTL definition and the initial netlist. The processor is configured to issue a notification of the sets of the endpoints between which the first logical relations were changed without changes to the second logical relations and the sets of the endpoints between which the second logical relations were changed without changes to the first logical relations, and to automatically verify, for the sets of the endpoints between which both the first logical relations and the second logical relations were changed, an equivalence between the first logical relations in the updated RTL definition and the second logical relations in the updated netlist.

There is additionally provided, in accordance with an embodiment of the invention, a computer software product, including a non-transitory computer-readable medium in which program instructions are stored, which instructions, when read by a computer, cause the computer to store an initial RTL definition of a design of a circuit, the design including multiple endpoints and first logical relations between sets of the endpoints, and an initial netlist of the circuit synthesized from the initial RTL definition, the netlist including second logical relations between the sets of the endpoints. The instructions further cause the computer to receive, after synthesis of the initial netlist, an updated RTL definition, containing a design change relative to the initial RTL definition, and a corresponding updated netlist, and to automatically analyze the updated RTL definition and the updated netlist in the design automation computer so as to identify the first logical relations and the second logical relations that were changed in the updated RTL definition and the updated netlist, respectively, relative to the initial RTL definition and the initial netlist, and to issue a notification of the sets of the endpoints between which the first logical relations were changed without changes to the second logical relations and the sets of the endpoints between which the second logical relations were changed without changes to the first logical relations, and to automatically verify, for the sets of the endpoints between which both the first logical relations and the second logical relations were changed, an equivalence between the first logical relations in the updated RTL definition and the second logical relations in the updated netlist.

The present invention will be more fully understood from the following detailed description of the embodiments thereof, taken together with the drawings in which:

DETAILED DESCRIPTION OF EMBODIMENTS

Overview

Figure 1:
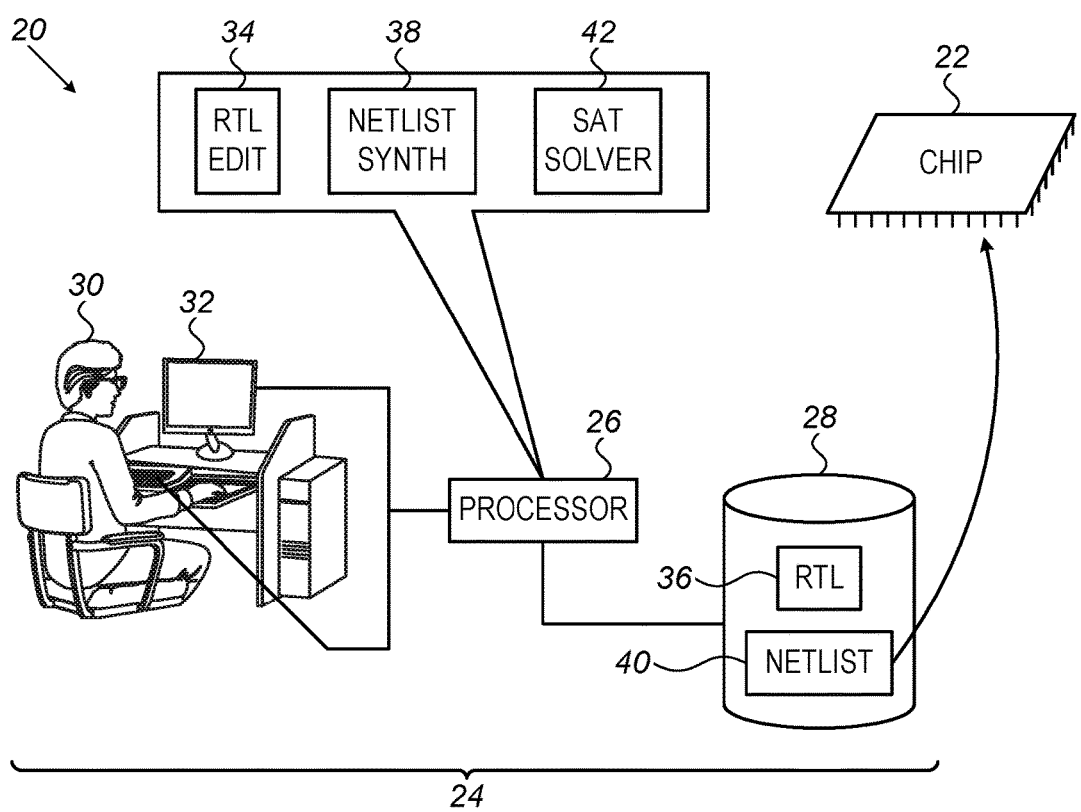
FIG. 1 is a block diagram that schematically illustrates a system for circuit design automation, in accordance with an embodiment of the invention.

When a netlist of a circuit is initially synthesized, based on an RTL definition of the circuit, the automatic tools that carry out the synthesis can be relied upon to ensure that the logical relations between the endpoints in the netlist are equivalent to those between the endpoints in the RTL definition. ("Equivalence" between a pair of logical relations, in the context of the present description and in the claims, means that for any set of values assigned to the input endpoints of the logical relations, the result at the output endpoints will be the same for both logical relations.) After an engineer has made changes to a netlist, for example in response to an ECO, it is important to verify that equivalence is maintained between all logical relations in the updated netlist and the corresponding relations in the updated RTL definition.

Given the complexity of modern digital circuit designs, this sort of verification of equivalence is not straightforward, particularly since different sorts of components and nets may be used in the netlist to implement a given logical relation. Manual verification by human engineers is therefore error-prone. Formal verification tools can be applied to the updated netlist in order to automatically verify full equivalence to the updated RTL definition; but the computational burden of verifying all endpoints and logical relations in a complex circuit can be prohibitive, requiring excessive amounts of computing time to complete.

Embodiments of the present invention that are described herein offer a more efficient approach to this problem, which focuses verification resources specifically where they are needed. Following a design change, such as an ECO, a design automation computer automatically analyzes the updated RTL definition and the updated netlist in order to identify the logical relations that have been changed in the updated RTL definition relative to the initial RTL definition, as well as the logical relations that have been changed in the updated netlist relative to the initial netlist. If the design change was implemented correctly, there should be a correspondence between the lists of changes in the RTL definition and those in the netlist, meaning that the logical relation between a set of endpoints in the netlist is changed if and only if the corresponding logical relation between the set of endpoints in the RTL definition has changed.

Therefore, if the logical relation between a set of the endpoints in the RTL definition changed without a change in the logical relation between the corresponding endpoints in the netlist, or vice versa, there is no need or purpose to expend resources in performing a formal verification over these endpoints. Rather, in such cases, the design automation computer in embodiments of the present invention simply issues a notification to the engineer, indicating that there is a bug to be fixed in this part of the circuit.

Furthermore, given the reliable assumption that the initial netlist was equivalent to the initial RTL definition, it can be assumed that the sets of endpoints among which the logical relations were found to have remained unchanged in both the updated RTL definition and in the updated netlist are still equivalent. The computer can therefore refrain from expending resources on any further verification of equivalence between these endpoints.

Thus, the only sets of endpoints still requiring verification at this stage are those among which the logical relations in both the updated RTL definition and the updated netlist are found to have changed. Therefore, in the disclosed embodiments, the computer automatically verifies the equivalence of the logical relations between such sets of endpoints in the updated RTL definition and those in the updated netlist. Typically, these are the only logical relations that are subjected to formal verification. For example, the computer can apply a satisfiability (SAT) solver to prove a proposition that the logical relations in question in the updated RTL definition and netlist are equivalent. This SAT-based verification can be facilitated by adding in the assumption that the logical relations were equivalent in the initial RTL definition and netlist, prior to the update.

In making and verifying the update to the netlist, it can also be useful to provide the engineer with a mapping (also referred to as an assignment) between wires in the RTL definition and corresponding nets in the netlist. In this context, the SAT solver can be used to verify the equivalence between the wires and the corresponding nets. Methods for performing this sort of mapping are beyond the scope of the present description, but are described, for example, in U.S. patent application Ser. No. 15/387,958, filed Dec. 22, 2016, whose disclosure is incorporated herein by reference.

System Description

FIG. 1 is a block diagram that schematically illustrates a system 20 for design of an integrated circuit chip 22, in accordance with an embodiment of the invention. System 20 comprises a design automation station 24, which is built, in the illustrated embodiment, on a general-purpose computer, comprising at least one processor 26 and a memory 28. Alternatively, the functions of station 24 that are described herein may be distributed among two or more separate computers. These functions of station 24 are typically implemented in software, which runs on processor 26. The software may be downloaded to station 24 in electronic form, over a network, for example. Additionally or alternatively, the software may be stored on non-transitory, tangible media, such as optical, magnetic or electronic memory media.

A user 30 of system 20, such as a VLSI circuit designer, generates an RTL definition 36 of chip 22 by operating a user interface 32 of station 24 to interact with an RTL editor 34 running on processor 26. Once the RTL definition is complete, user 30 invokes a netlist synthesizer 38 (also a software component) running on processor 26 to automatically convert RTL definition 36 to a gate-level netlist 40, which is then used in subsequent steps of the actual physical design of chip 22. These latter steps are beyond the scope of the present description. Although only a single user 30 is shown in the figure for the sake of simplicity, in practice the design of chip 22 is typically a collaborative effort, involving multiple engineers, including one or more engineers who develop the RTL definition and others who work on the netlist and physical design.

Even after netlist 40 has been synthesized and physical layout has begun, user 30 may continue to debug and update RTL definition 36. As noted earlier, resynthesizing netlist 40 after each such update is often not practical. Therefore, when a change is made in RTL definition 36, an ECO is issued to the engineers working on netlist 40. These latter engineers make changes to the netlist that are intended to implement the ECO.

When the changes to the netlist have been completed, processor 26 verifies that the updated netlist is equivalent to the updated RTL definition following the ECO. To support this verification step, processor 26 can use a SAT solver 42—a software component that automatically tests whether the logical relation between a set of endpoints in the RTL definition is equivalent to the logical relation between the same set of endpoints in the netlist. Any suitable SAT solver that is known in the art can be used for this purpose. For example, the open-source MiniSat SAT solver (available for download at minisat.se) may readily be adapted for the sort of equivalence testing that is described herein. As noted earlier, however, processor 26 first identifies the endpoints among which the logical relations have changed in either the RTL definition or the netlist, or both, and then applies SAT solver 42 selectively, only to those sets of the endpoints between which the logical relations in both the RTL definition and the netlist were found to have changed.

Methods of Operation

FIGS. 2A-2D are schematic circuit diagrams showing comparisons between RTL circuit definitions 50 and netlist layouts 52, in accordance with an embodiment of the invention. These figures illustrate the different sorts of cases that can arise in implementing an ECO, as well as the potential difficulty in verifying that the updated netlist layout following the ECO is equivalent to the updated RTL definition.

Figure 2A:
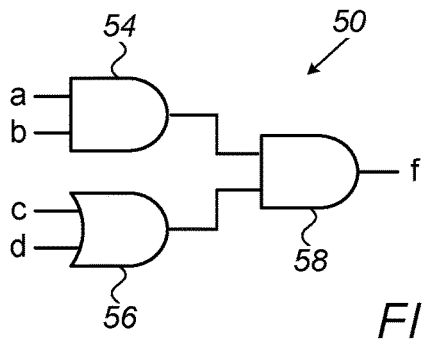
FIGS. 2A-2D are schematic circuit diagrams showing comparisons between RTL circuit designs and netlist layouts, in accordance with an embodiment of the invention.
Figure 2A:
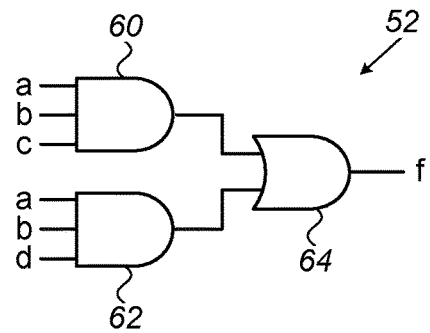

FIG. 2A shows the initial design of a part of a circuit comprising endpoints a, b, c, d and f. In this example, endpoints a, b, c and d are the inputs to the circuit, while endpoint f is the output. RTL definition 50 includes an AND gate 54 and an OR gate 56, which feed another AND gate 58. The logical relation between the endpoints in this circuit can be written as f=ab(c+d). For reasons of layout convenience, however, netlist synthesizer 38 (FIG. 1) has translated this RTL definition into netlist layout 52, which includes a pair of three-input AND gates 60 and 62, feeding an OR gate 64. The logical relation in this case is f=abc+abd, which is algebraically equivalent to f=ab(c+d). Following the ECO update to RTL definition 36 and netlist 40, as long as definition 50 and layout 52 have not changed, there is no need for processor 26 to recheck their equivalence.

Figure 2B:
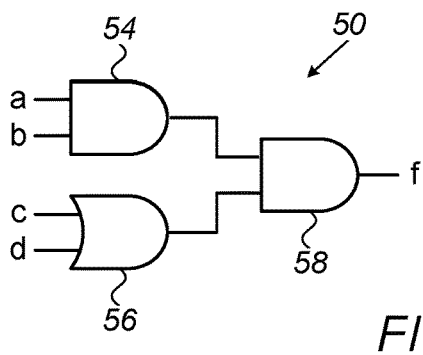
Figure 2B:
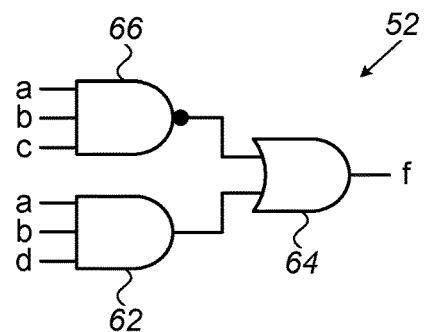
Figure 2C:
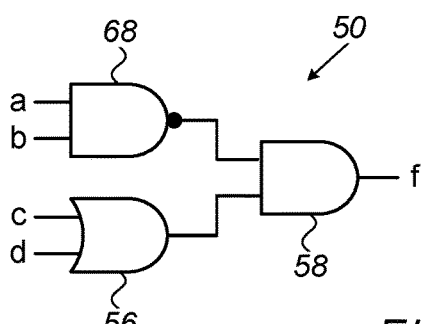
Figure 2C:
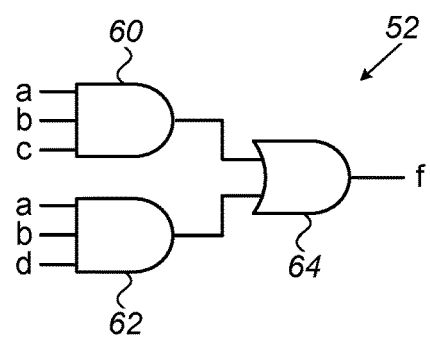

In FIG. 2B, on the other hand, AND gate 60 has been replaced by a NAND gate 66 in updating netlist layout 52, without any change in RTL definition 50; whereas in FIG. 2C, RTL definition 50 has been updated by replacing AND gate 54 with a NAND gate 68, without any change in netlist layout 52. In both of these cases, processor 26 can conclude immediately, simply by comparing the post-update circuits to the initial circuits, that the netlist engineer has made an error in implementing the ECO, and the parts of the circuits connecting inputs a, b, c and d to output f are no longer equivalent. Processor 26 notifies user 30, via user interface 32 for example, of this error, without having to perform any further verification with respect to this set of endpoints.

Figure 2D:
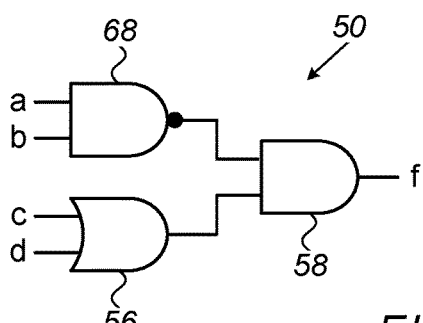
Figure 2D:
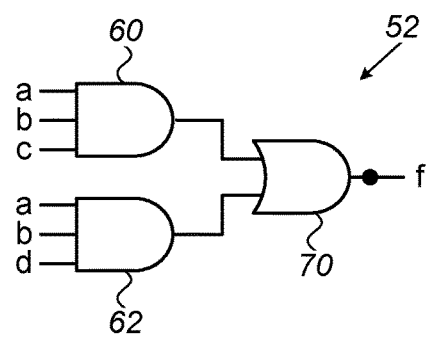

In FIG. 2D, both RTL definition 50 and netlist layout 52 have been changed: AND gate 54 in RTL definition 50 has been replaced by NAND gate 68; and OR gate 64 in netlist layout 52 has been replaced by NOR gate 70. In this case, processor 26 cannot immediately assume either equivalence or non-equivalence between the updated RTL definition and netlist layout. In fact, algebraic evaluation shows that the netlist engineer has implemented the ECO correctly in this case, but in complex circuits, this simple sort of evaluation is often not feasible. Therefore, processor 26 applies a further verification procedure, using SAT solver 42, to verify that circuits 50 and 52 give the same output value for all possible input values, and are thus equivalent.

Figure 3:
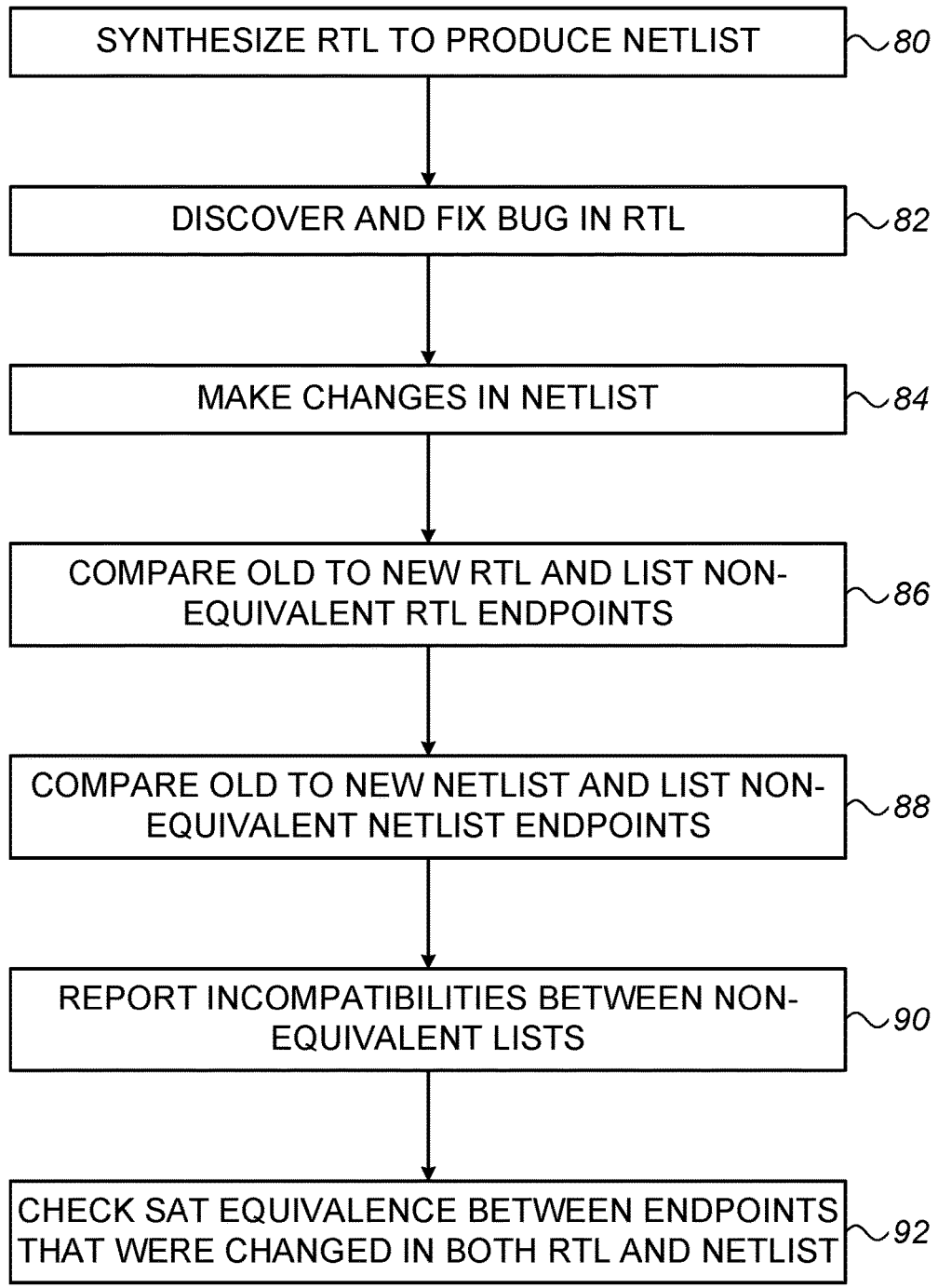
FIG. 3 is a flow chart that schematically illustrates a method for circuit design and equivalence checking, in accordance with an embodiment of the invention.

FIG. 3 is a flow chart that schematically illustrates a method for circuit design and equivalence checking, in accordance with an embodiment of the invention. This method is described, for the sake of clarity and convenience, with reference to the elements of system 20 that are described above. The principles of this method, however, may similarly be implemented in other sorts of circuit design systems.

After user 30 has completed an initial RTL definition 36, processor 26 runs netlist synthesizer 38 to produce the corresponding initial netlist 40, at a netlist synthesis step 80. Subsequent to netlist synthesis, in the present example, a bug is found in RTL definition 36, at a bug discovery step 82. An RTL design engineer fixes the bug, thus updating the RTL definition, and issues an ECO. In response, a netlist engineer makes changes in netlist 40, at a netlist update step 84.

To verify that the changes have been made correctly, processor 26 automatically analyzes the updated RTL definition so as to identify logical relations between endpoints in the RTL definition that were changed relative to the initial RTL definition, at an RTL comparison step 86. Similarly, processor 26 automatically analyzes the updated netlist to identify logical relations between endpoints that were changed relative to the initial netlist, at a netlist comparison step 88. Processor 26 thus assembles a list of endpoints for which the updated RTL definition specifies logical relations that are not equivalent to the initial RTL definition, along with a list of endpoints for which the updated netlist contains logical relations that are not equivalent to the initial netlist.

Processor 26 compares the two lists in order detect incompatibilities, at a list checking step 90. As explained earlier, at this step, processor 26 identifies the sets of the endpoints between which the logical relations were changed either in the updated RTL definition or in the updated netlist, but not in both. (The sets of endpoints in the RTL definition can be identified with the corresponding sets of endpoints in the netlist because netlist synthesizer 38 typically preserves endpoint names in the synthesis process.) Processor 26 reports these discrepancies to user 30, for example via user interface 32.

For the sets of endpoints that appear on both lists, i.e., the endpoints between which the logical relations were changed in both the updated RTL definition and the updated netlist, processor 26 automatically verifies the equivalence of the changes, at an equivalence checking step 92. Various techniques that are known in the art can be used for this purpose. In the present example, processor 26 applies SAT solver 42 to prove the proposition that the logical relations in question in the updated RTL definition are equivalent to the corresponding logical relations in the updated netlist. As noted earlier, the SAT solver need be applied only to the sets of the endpoints appearing on both of the lists assembled by the processor at steps 86 and 88 above. In referring the verification problem to SAT solver 42, processor 26 adds an assumption that the corresponding logical relations in the initial RTL definition and the initial netlist were equivalent. This assumption limits the range of possible scenarios that the SAT solver has to test in order to reach a conclusion that the changes are equivalent.

SAT solver 42 proves equivalence by searching for a counter-example, in this case meaning a set of initial assignments of input variables that result in different outputs when applied to the updated RTL definition and to the netlist. The absence of such a counter-example proves that the logical relations in the updated RTL definition and the updated netlist are indeed equivalent. If a counter-example is found at step 92, processor 26 issues a report of the counter-example, thus identifying the endpoints in netlist 40 between which the bug was found.

To assist the user in fixing the bug, processor 26 can search the netlist for signals that affect the endpoints in question, and thus identify the nets in the updated netlist that are associated with these endpoints. In particular, processor 26 can assist the user by identifying and reporting fan-in differences between the end points in the initial and updated netlists, and thus finding the difference between the inputs that affect the endpoint in the initial and updated netlists. The netlist engineer can use these differences as a clue in finding the changes that need to be made in order to correct the bug. After the engineer has attempted to fix the bug, processor 26 can rerun the preceding steps of the present method in order to verify that all logical relations are now equivalent.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for circuit design automation, comprising:
receiving an initial RTL definition of a design of a circuit, the design comprising multiple endpoints and first logical relations between sets of the endpoints;
synthesizing an initial netlist of the circuit based on the initial RTL definition, the netlist comprising second logical relations between the sets of the endpoints;
after synthesizing the initial netlist, receiving in a design automation computer an updated RTL definition, containing a design change relative to the initial RTL definition, and a corresponding updated netlist;
automatically analyzing the updated RTL definition and the updated netlist in the design automation computer so as to identify the first logical relations and the second logical relations that were changed in the updated RTL definition and the updated netlist, respectively, relative to the initial RTL definition and the initial netlist;
issuing a notification from the design automation computer of the sets of the endpoints between which the first logical relations were changed without changes to the second logical relations and the sets of the endpoints between which the second logical relations were changed without changes to the first logical relations; and
for the sets of the endpoints between which both the first logical relations and the second logical relations were changed, automatically verifying, in the design automation computer, an equivalence between the first logical relations in the updated RTL definition and the second logical relations in the updated netlist,
wherein automatically analyzing the updated RTL definition and the updated netlist comprises identifying the sets of the endpoints between which neither the first logical relations nor the second logical relations were changed in the updated RTL definition and the updated netlist, wherein the design automation computer does not verify the equivalence between the first logical relations in the updated RTL definition and the second logical relations in the updated netlist for the identified sets, and
wherein the design automation computer verifies the equivalence between the first logical relations in the updated RTL definition and the second logical relations in the updated netlist only for the sets of the endpoints between which both the first logical relations and the second logical relations were changed.

2. The method according to claim 1, wherein automatically verifying the equivalence comprises applying a satisfiability (SAT) solver to prove a proposition that the first logical relations in the updated RTL definition and the second logical relations in the updated netlist are equivalent for the sets of the endpoints between which both the first logical relations and the second logical relations were changed,
wherein the SAT solver is applied under an assumption that the first logical relations were equivalent to the second logical relations in the initial RTL definition and the initial netlist.

3. The method according to claim 1, and comprising automatically making an assignment between wires in the RTL definition and corresponding nets in the netlist, while applying a satisfiability (SAT) solver to verify that one or more of the wires are equivalent to one or more of the corresponding nets.

4. A method for circuit design automation, comprising:
receiving an initial RTL definition of a design of a circuit, the design comprising multiple endpoints and first logical relations between sets of the endpoints;
synthesizing an initial netlist of the circuit based on the initial RTL definition, the netlist comprising second logical relations between the sets of the endpoints;
after synthesizing the initial netlist, receiving in a design automation computer an updated RTL definition, containing a design change relative to the initial RTL definition, and a corresponding updated netlist;
automatically analyzing the updated RTL definition and the updated netlist in the design automation computer so as to identify the first logical relations and the second logical relations that were changed in the updated RTL definition and the updated netlist, respectively, relative to the initial RTL definition and the initial netlist;
issuing a notification from the design automation computer of the sets of the endpoints between which the first logical relations were changed without changes to the second logical relations and the sets of the endpoints between which the second logical relations were changed without changes to the first logical relations; and
for the sets of the endpoints between which both the first logical relations and the second logical relations were changed, automatically verifying, in the design automation computer, an equivalence between the first logical relations in the updated RTL definition and the second logical relations in the updated netlist,
wherein automatically verifying the equivalence comprises applying a satisfiability (SAT) solver to prove a proposition that the first logical relations in the updated RTL definition and the second logical relations in the updated netlist are equivalent for the sets of the endpoints between which both the first logical relations and the second logical relations were changed,
wherein the SAT solver is applied under an assumption that the first logical relations were equivalent to the second logical relations in the initial RTL definition and the initial netlist, and
wherein applying the SAT solver comprises finding a counter-example demonstrating that at least one of the second logical relations in the updated netlist is not equivalent to a corresponding first logical relation in the updated RTL definition, and identifying and reporting a fan-in difference between the end points of the at least one of the second logical relations in the initial and updated netlists.

5. The method according to claim 4, wherein identifying and reporting the fan-in difference comprises identifying nets in the updated netlist that are associated with an endpoint of the at least one of the second logical relations.

6. The method according to claim 5, wherein identifying the nets comprises finding a difference between inputs that affect the endpoint in the initial and updated netlists.

7. Apparatus for circuit design automation, comprising:
a memory, which is configured to store an initial RTL definition of a design of a circuit, the design comprising multiple endpoints and first logical relations between sets of the endpoints, and an initial netlist of the circuit synthesized from the initial RTL definition, the netlist comprising second logical relations between the sets of the endpoints;
a processor, which is coupled to receive, after synthesis of the initial netlist, an updated RTL definition, containing a design change relative to the initial RTL definition, and a corresponding updated netlist, and which is configured to automatically analyze the updated RTL definition and the updated netlist in the design automation computer so as to identify the first logical relations and the second logical relations that were changed in the updated RTL definition and the updated netlist, respectively, relative to the initial RTL definition and the initial netlist, and to issue a notification of the sets of the endpoints between which the first logical relations were changed without changes to the second logical relations and the sets of the endpoints between which the second logical relations were changed without changes to the first logical relations, and to automatically verify, for the sets of the endpoints between which both the first logical relations and the second logical relations were changed, an equivalence between the first logical relations in the updated RTL definition and the second logical relations in the updated netlist,
wherein the processor is configured to identify the sets of the endpoints between which neither the first logical relations nor the second logical relations were changed in the updated RTL definition and the updated netlist, and to refrain from verifying the equivalence between the first logical relations in the updated RTL definition and the second logical relations in the updated netlist for the identified sets, and
wherein the processor is configured to verify the equivalence between the first logical relations in the updated RTL definition and the second logical relations in the updated netlist only for the sets of the endpoints between which both the first logical relations and the second logical relations were changed.

8. The apparatus according to claim 7, wherein the processor is configured to automatically verify the equivalence by applying a satisfiability (SAT) solver to prove a proposition that the first logical relations in the updated RTL definition and the second logical relations in the updated netlist are equivalent for the sets of the endpoints between which both the first logical relations and the second logical relations were changed,
wherein the SAT solver is applied under an assumption that the first logical relations were equivalent to the second logical relations in the initial RTL definition and the initial netlist.

9. The apparatus according to claim 7, wherein the processor is configured to make an assignment between wires in the RTL definition and corresponding nets in the netlist, while applying a satisfiability (SAT) solver to verify that one or more of the wires are equivalent to one or more of the corresponding nets.

10. Apparatus for circuit design automation, comprising:
a memory, which is configured to store an initial RTL definition of a design of a circuit, the design comprising multiple endpoints and first logical relations between sets of the endpoints, and an initial netlist of the circuit synthesized from the initial RTL definition, the netlist comprising second logical relations between the sets of the endpoints;
a processor, which is coupled to receive, after synthesis of the initial netlist, an updated RTL definition, containing a design change relative to the initial RTL definition, and a corresponding updated netlist, and which is configured to automatically analyze the updated RTL definition and the updated netlist in the design automation computer so as to identify the first logical relations and the second logical relations that were changed in the updated RTL definition and the updated netlist, respectively, relative to the initial RTL definition and the initial netlist, and to issue a notification of the sets of the endpoints between which the first logical relations were changed without changes to the second logical relations and the sets of the endpoints between which the second logical relations were changed without changes to the first logical relations, and to automatically verify, for the sets of the endpoints between which both the first logical relations and the second logical relations were changed, an equivalence between the first logical relations in the updated RTL definition and the second logical relations in the updated netlist, wherein the processor is configured to automatically verify the equivalence by applying a satisfiability (SAT) solver to prove a proposition that the first logical relations in the updated RTL definition and the second logical relations in the updated netlist are equivalent for the sets of the endpoints between which both the first logical relations and the second logical relations were changed, wherein the SAT solver is applied under an assumption that the first logical relations were equivalent to the second logical relations in the initial RTL definition and the initial netlist, and wherein applying the SAT solver comprises finding a counter-example demonstrating that at least one of the second logical relations in the updated netlist is not equivalent to a corresponding first logical relation in the updated RTL definition, and identifying and reporting a fan-in difference between the end points of the at least one of the second logical relations in the initial and updated netlists.

11. The apparatus according to claim 10, wherein identifying and reporting the fan-in difference comprises identifying nets in the updated netlist that are associated with an endpoint of the at least one of the second logical relations.

12. The apparatus according to claim 11, wherein identifying the nets comprises finding a difference between inputs that affect the endpoint in the initial and updated netlists.

13. A computer software product, comprising a non-transitory computer-readable medium in which program instructions are stored, which instructions, when read by a computer, cause the computer to store an initial RTL definition of a design of a circuit, the design comprising multiple endpoints and first logical relations between sets of the endpoints, and an initial netlist of the circuit synthesized from the initial RTL definition, the netlist comprising second logical relations between the sets of the endpoints, wherein the instructions further cause the computer to receive, after synthesis of the initial netlist, an updated RTL definition, containing a design change relative to the initial RTL definition, and a corresponding updated netlist, and to automatically analyze the updated RTL definition and the updated netlist in the design automation computer so as to identify the first logical relations and the second logical relations that were changed in the updated RTL definition and the updated netlist, respectively, relative to the initial RTL definition and the initial netlist, and to issue a notification of the sets of the endpoints between which the first logical relations were changed without changes to the second logical relations and the sets of the endpoints between which the second logical relations were changed without changes to the first logical relations, and to automatically verify, for the sets of the endpoints between which both the first logical relations and the second logical relations were changed, an equivalence between the first logical relations in the updated RTL definition and the second logical relations in the updated netlist, wherein the instructions cause the computer to identify the sets of the endpoints between which neither the first logical relations nor the second logical relations were changed in the updated RTL definition and the updated netlist, and to refrain from verifying the equivalence between the first logical relations in the updated RTL definition and the second logical relations in the updated netlist for the identified sets, and wherein the instructions cause the computer to verify the equivalence between the first logical relations in the updated RTL definition and the second logical relations in the updated netlist only for the sets of the endpoints between which both the first logical relations and the second logical relations were changed.

* * * * *